(12) United States Patent
Kramer et al.

(10) Patent No.: US 9,903,903 B2
(45) Date of Patent: Feb. 27, 2018

(54) METHOD AND DEVICE FOR DETERMINING AN OPERATING PARAMETER OF A FLUID INSULATED ELECTRICAL APPARATUS

(71) Applicants: Axel Kramer, Wettingen (CH); Thomas Alfred Paul, Waedenswil (CH); Navid Mahdizadeh, Baden (CH); Nitesh Ranjan, Wettingen (CH)

(72) Inventors: Axel Kramer, Wettingen (CH); Thomas Alfred Paul, Waedenswil (CH); Navid Mahdizadeh, Baden (CH); Nitesh Ranjan, Wettingen (CH)

(73) Assignee: ABB Technology AG (CH)

(*) Notice: Subject to any disclaimer, the term of this patent is extended or adjusted under 35 U.S.C. 154(b) by 708 days.

(21) Appl. No.: 14/304,647

(22) Filed: Jun. 13, 2014

(65) Prior Publication Data
US 2014/0306718 A1    Oct. 16, 2014

Related U.S. Application Data

(63) Continuation of application No. PCT/EP2012/075209, filed on Dec. 12, 2012, which
(Continued)

(51) Int. Cl.
*G01R 31/00* (2006.01)
*G01R 31/12* (2006.01)
(Continued)

(52) U.S. Cl.
CPC ......... *G01R 31/1281* (2013.01); *G01R 31/06* (2013.01); *G01R 31/3275* (2013.01); *H01H 33/563* (2013.01); *H01H 2033/566* (2013.01)

(58) Field of Classification Search
None
See application file for complete search history.

(56) References Cited

U.S. PATENT DOCUMENTS 6,272,905 B1    8/2001    Drzewiecki
6,276,190 B1    8/2001    Zamfes
(Continued)

FOREIGN PATENT DOCUMENTS

EP    1085635 A2    3/2001
JP    2001086611 A    3/2001
(Continued)

OTHER PUBLICATIONS

Raghavender, et al.; "A Comprehensive Study of Lightning Impulse Breakdown and Cost/Benefit Analysis of Ternary Gas Mixtures Containing Two Electronegative Gases"; pp. 141-144.
(Continued)

*Primary Examiner* — David M Gray
*Assistant Examiner* — Geoffrey T Evans
(74) *Attorney, Agent, or Firm* — St. Onge Steward Johnston & Reens, LLC (57) ABSTRACT

A method for deriving at least one operating parameter of a fluid-insulated electrical apparatus, in particular of gas-insulated switchgear. The operating parameter is dependent on a dielectric breakdown strength of an insulation fluid of the electrical apparatus. The insulation fluid includes at least three components that are assigned to at least a first and a second component group such that at least one component group comprises at least two components. The component groups differ in their weighted average values of the molecular masses of the components in the respective component groups. At least one quantity which is indicative of the concentration of the first component group and of the concentration of the second component group is determined
(Continued)

from the insulation fluid, e.g. by measuring one or more measurement variables with one or more sensors. The operating parameter is then derived using the at least one quantity.

40 Claims, 2 Drawing Sheets

Related U.S. Application Data is a continuation of application No. PCT/EP2012/067217, filed on Sep. 4, 2012, which is a continuation of application No. PCT/EP2011/072515, filed on Dec. 13, 2011.

(51) Int. Cl.
*H01H 33/56* (2006.01)
*G01R 31/06* (2006.01)
*G01R 31/327* (2006.01)

(56) References Cited

U.S. PATENT DOCUMENTS

| | | | |
|---|---|---|---|
| 6,305,212 B1 | 10/2001 | Drzewiecki | |
| 7,184,895 B2 | 2/2007 | Chetay et al. | |
| 2002/0095262 A1 | 7/2002 | Chetay et al. | |
| 2007/0221626 A1 | 9/2007 | Uchii | |
| 2011/0127237 A1* | 6/2011 | Uchii | H01H 33/22 218/46 |
| 2013/0277334 A1* | 10/2013 | Mantilla | H01B 3/56 218/85 |
| 2014/0190726 A1* | 7/2014 | Kieffel | H01H 33/22 174/17 GF |
| 2014/0321031 A1* | 10/2014 | Kramer | G01N 33/0032 361/618 |

FOREIGN PATENT DOCUMENTS

| | | |
|---|---|---|
| JP | 2010021263 A | 1/2010 |
| WO | 2010043268 A1 | 4/2010 |

OTHER PUBLICATIONS

Anonymous: "CBWatch-2 Modular Circuit Breaker Monitoring System"; Alstom Product Brochure; Sep. 1, 2010; 4 pages.
International Search Report and Written Opinion of the International Searching Authority Application No. PCT/EP2012/075209 Completed: Mar. 20, 2013; dated Apr. 2, 2013 15 pages.
T. Löfquist et. al: "Speed of Sound Measurements in Gas-Mixtures at Varying Composition Using an Ultrasonic Gas Flow Meter With Silicon Based Transducers" (e.g. http://pure.ltu.se/portal/files/60931/artikel.pdf as ac-cessed on Nov. 18, 2011).
"Thermodynamic equation describing the state of matter under a given set of physical conditions", from http://en.wikipedia.org/wiki/Equation_of_state as accessed on Nov. 16, 2011; 10 pages.

* cited by examiner

Synergy(x) = $0.37[e^{-x/0.3} - e^{-x/0.026}] + 1$; where x is the mole fraction of C5/C6 in air

Fig. 4

METHOD AND DEVICE FOR DETERMINING AN OPERATING PARAMETER OF A FLUID INSULATED ELECTRICAL APPARATUS

FIELD OF THE INVENTION

The present invention relates to methods for deriving at least one operating parameter P of a fluid-insulated electrical apparatus and for operating such an electrical apparatus. Furthermore, it relates to such an electrical apparatus having an analysis and control unit implementing such a method.

BACKGROUND OF THE INVENTION

Dielectric insulation media in liquid and/or gaseous states (i.e. fluids) are widely applied to insulate an electrically active part in a variety of electrical apparatuses, such as switchgears or transformers. For example, the electrically active part in medium or high voltage metal-encapsulated switchgears is arranged in a gas-tight compartment which encloses an insulation gas with a pressure of several bars, which electrically separates the compartment of the apparatus from the electrically active part. In other words, the insulation gas does not allow the passage of electrical current from the electrically active part to the compartment. In order to maintain the safety and functionality of the electrical apparatus, one or more operating parameters of the electrical apparatus which depend on the dielectric breakdown strength $E_{bd}$ of the insulation fluid should be derived.

A commonly used dielectric insulation gas is sulfur hexafluoride ($SF_6$) which exhibits excellent insulation and electric arc extinguishing capabilities. However, $SF_6$ is a strong contributor to the green-house effect and thus has a high global warming potential. Therefore, alternative insulation fluids should be found. Several alternative insulation fluids have been identified. Some of these alternatives comprise multi-component fluid mixtures, i.e. they comprise more than one molecular or atomic species. Because the dielectric breakdown strength $E_{bd}$ of such multi-component fluid mixtures depends, e.g., on the concentration ratio of the mixture components, its derivation becomes more complicated than for single component insulation fluids, however.

US 2002/0095262 A1 and U.S. Pat. No. 7,184,895 B2 describe methods and devices for monitoring the proportion of a component in a gaseous insulation medium consisting of at least two components.

The disclosed methods and devices have the disadvantage, however, that they do not determine the dielectric breakdown strength $E_{bd}$ or an $E_{bd}$-dependent operating parameter, which is a prominent parameter relevant for assessment of an operating state of the gas-insulated electrical apparatus.

SUMMARY OF THE INVENTION

Hence it is a general objective of the present invention to provide an improved method for deriving at least one operating parameter P of a fluid-insulated electrical apparatus, wherein the operating parameter P depends on a dielectric breakdown strength $E_{bd}$ of an insulation fluid of the electrical apparatus. Further objectives of the invention are to provide a method for operating such a fluid-insulated electrical apparatus and to provide a fluid-insulated electrical apparatus which is operated by such a method. It is another objective of the invention to provide a computer program element which implements such a method.

These objectives are achieved by the method and devices of the independent claims.

Accordingly, a method for deriving at least one operating parameter P (e.g. indicating an "operational" or "failure" state) of a fluid-insulated electrical apparatus (e.g. of gas-insulated medium or high voltage switchgear) comprises the step of assigning at least three components X, Y, and Z of an insulation fluid of the electrical apparatus to at least a first component group A and to at least a second component group B. The operating parameter P is dependent on a dielectric breakdown strength $E_{bd}$ (e.g. an insulation strength) of the insulation fluid. As stated above, the insulation fluid of the electrical apparatus comprises at least three components X, Y, and Z with respective component concentrations $c(X)=c_X$, $c(Y)=c_Y$, and $c(Z)=c_Z$. The first component group A has a group concentration $c_A$ and the second component group B has a group concentration $c_B$. Furthermore, at least one of the component groups A and B comprises at least two of the components X, Y, and Z. In other words, either at least the first component group A comprises at least two of the components X, Y, and Z, or at least the second component group B comprises at least two of the components X, Y, and Z. As an example, the first component group A can comprise the components X and Y and the second component group can comprise the component Z.

The method further comprises the method element of determining at least one quantity of the insulation fluid (e.g. a pressure, a temperature, and/or a density) which is indicative of the group concentration $c_A$ of the first component group A and of the group concentration $c_B$ of the second component group B. The term "indicative" in this respect means that the group concentrations $c_A$ and $c_B$ of the first and second component groups A and B are derivable using the at least one quantity. Optionally, a plurality of such quantities can be determined from the insulation fluid.

Specifically, the method comprises the method element of measuring a plurality of measurement variables (e.g. indicative of the pressure p and/or the temperature T and/or the density ρ of the insulation fluid) by means of at least one sensor. Then, the at least one quantity which is indicative of the group concentrations $c_A$ and $c_B$ of the first and second component groups A and B is determined using these measurement variables. Thus, by measuring the measurement variable or variables, the group concentrations $c_A$ and $c_B$ of the first and second component groups A and B are easier to determine.

Then, the operating parameter P of the fluid-insulated electrical apparatus is derived using the at least one quantity or—alternatively or in addition—the dielectric break-down strength $E_{bd}$ of the insulation fluid is derived using the group concentrations $c_A$ and $c_B$ themselves. Thus, the operating parameter P which is dependent on the dielectric breakdown strength $E_{bd}$ of the insulation fluid of the electrical apparatus can be derived using the at least one quantity which is indicative of the group concentrations $c_A$ and $c_B$. By grouping at least two components into one component group, the number of unknowns is reduced which, e.g., enables the derivation of the operating parameter P from a smaller number of the quantities.

In embodiments, the at least three components X, Y, and Z are assigned to the at least two component groups A and B in such a way that a weighted average value $M_A$ of a molecular mass of the component or components in the first component group A differs from a weighted average value $M_B$ of a molecular mass of the component or components in the second component group B. The term "weighted average value of a molecular mass" relates to an average value of the molecular masses of the respective components (in one component group) which is weighted by their relative concentrations. Thus, the components X, Y, and Z can be assigned to the first and second component groups based on their molecular masses. As an example, for a mixture of 80% nitrogen $N_2$ with a molecular mass of 28 g/mol and 20% oxygen $O_2$ with a molecular mass of 32 g/mol in component group A, a weighted average value of the molecular mass of $M_A$=0.2*32 g/mol+0.8*28 g/mol=28.8 g/mol results. If the second component group B comprises, e.g., only one component "perfluoroketone C6" (see definition below) with a molecular mass of M(C6)=316 g/mol, the weighted average value of the molecular mass $M_B$=316 g/mol for this component group B is equal to the molecular mass of the one component.

In embodiments, an absolute value $|M_A-M_B|$ of the difference between the weighted average values $M_A$-$M_B$ of the molecular masses of the components X, Y, and Z between the first and second component groups A and B is larger than weighted statistical spreads $\sigma_{M,A}$ and $\sigma_{M,B}$ of the molecular masses of the components X, Y, and Z within the first and second component groups A and B. In other words, the absolute "distance" between the component groups A and B in terms of weighted average molecular masses (distance with regard to an absolute value of the difference between the respective weighted average values of the single component groups, see FIG. 2) is larger than a "distribution width" (in a statistical sense, e.g. a standard deviation or a weighted standard deviation of the distribution of the components' values) of the molecular masses of the single components within the component groups A and B (distribution width with regard to a statistical width of the distribution). For the above example—as stated above—$M_A$ equals to 28.8 g/mol for an 80%:20% $N_2$:$O_2$ mixture in component group A. Furthermore, $M_B$, e.g., equals to 316 g/mol for a single component "perfluoroketone C6" (see definition below) in the component group B. Then, $|M_A-M_B|$=287.2 g/mol. An (unweighted) standard deviation in component group A is $\sigma_{M,A}$=2.83 g/mol, whereas a weighted standard deviation would be $\sigma_{M,A}$=2.26 g/mol. An (unweighted and weighted) standard deviation in component group B is $\sigma_{M,B}$=0 (only one component!) by definition. Therefore, the statistical spreads $\sigma_{M,A}$ and $\sigma_{M,B}$ are both smaller than $|M_A-M_B|$. Thus, the component groups A and B can be populated with the components X, Y, and Z based on similar molecular masses.

In other embodiments, an absolute value $|M_A-M_B|$ of the difference between the weighted average values $M_A$-$M_B$ of the molecular masses of the components X, Y, and Z between the first and second component groups A and B is larger than 20 g/mol, preferably larger than 50 g/mol, and more preferably larger than 100 g/mol. This has the advantage that the component groups A and B are separated from each other in terms of the average molecular masses of their respective components.

In other embodiments of the method, the at least three components X, Y, and Z are assigned to the at least two component groups A and B in such a way that a weighted average value $E_{crit,A}$ of a critical field strength of the component or components in the first component group A differs from a weighted average value $E_{crit,B}$ of a critical field strength of the component or components in the second component group B. The term "critical field strength" herein relates to a component or component group specific quantity which is a (statistical) measure of a component or group concentration normalized electrical field that the component or component group of the insulation fluid can maintain without losing its insulating (dielectric) properties and beyond which the component or component group loses these insulating properties resulting in electrical breakdown. In other words, the "critical field strength" describes an upper threshold for a stable state of dielectric insulation of the respective component or component group. Thus, the components X, Y, and Z can be assigned to the first and second component groups based on their critical field strengths.

In embodiments, an absolute value $|E_{crit,A}-E_{crit,B}|$ of the difference between the weighted average values $E_{crit,A}$-$E_{crit,B}$ of the critical field strengths of the components X, Y, and Z between the first and second component groups A and B is larger than weighted statistical spreads $\sigma_{Ecrit,A}$ and $\sigma_{Ecrit,B}$ of the critical field strengths of the components X, Y, and Z within the first and second component groups A and B. In other words, the absolute "distance" between the component groups A and B in terms of weighted average critical field strengths (distance with regard to an absolute value of the difference between the respective weighted average values in the component groups) is larger than a "distribution width" (in a statistical sense, e.g. a standard deviation or a weighted standard deviation of the distribution of the components' values) of the critical field strengths of the single components within the component groups A and B (distribution width with regard to a statistical width of the distribution). Thus, the component groups A and B can be populated with the components X, Y, and Z based on similar critical field strengths.

In other embodiments of the method, the second component group B comprises at least one of the components selected from the group consisting of:
sulfur hexafluoride,
partially or fully fluorinated ethers, in particular hydrofluoroethers, hydrofluoro monoethers, hydrofluoro monoethers containing at least 3 carbon atoms, perfluoro monoethers, or perfluoro monoethers containing at least 4 carbon atoms,
partially or fully fluorinated ketones, in particular hydrofluoro monoketones, perfluoro monoketones, perfluoro monoketones comprising at least 5 carbon atoms, or perfluoro monoketones comprising exactly 5 or 6 or 7 or 8 carbon atoms, and
mixtures thereof.
The first component group A comprises at least one of the components selected from the group consisting of:
nitrogen,
oxygen,
carbon dioxide,
nitric oxide,
nitrogen dioxide,
nitrous oxide,
argon,
methanes, in particular partially or fully halogenated methanes, in particular tetrafluoromethane or trifluoroiodomethane,
air, in particular technical air or synthetic air, and
mixtures thereof.
Thus, an improved insulation performance can be achieved for the insulation fluid of the electrical apparatus.

In embodiments, the second component group B comprises at least one component selected from the group consisting of:

cyclic and/or aliphatic fluoropentanones, preferably cyclic and/or aliphatic perfluoropentanones, more preferably 1,1,1,3,4,4,4-heptafluoro-3-(tri-fluoro-methyl)butan-2-one, cyclic and/or aliphatic fluorohexanones, preferably cyclic and/or aliphatic perfluorohexanones, more preferably 1,1,1,2,4,4,5,5,5-nonafluoro-4-(tri-fluoromethyl)pentan-3-one, cyclic and/or aliphatic fluoroheptanones, preferably cyclic and/or aliphatic perfluoroheptanones, sulfur hexafluoride, and hydrofluoroethers.

Thus, an improved insulation performance can be achieved for the insulation fluid of the electrical apparatus.

In other embodiments, the first component group A comprises:

the components nitrogen and oxygen with relative partial pressures between $p(N_2)/(p(O_2)+p(N_2))=0.7$, $p(O_2)/(p(O_2)+p(N_2))=0.3$ and $p(N_2)/(p(O_2)+p(N_2))=0.95$, $p(O_2)/(p(O_2)+p(N_2))=0.05$, or the components carbon dioxide and oxygen with relative partial pressures between $p(CO_2)/(p(O_2)+p(CO_2))=0.6$, $p(O_2)/(p(O_2)+p(CO_2))=0.4$ and $p(CO_2)/(p(O_2)+p(CO_2))=0.99$, $p(O_2)/(p(O_2)+p(CO_2))=0.01$, or the components carbon dioxide and nitrogen with relative partial pressures between $p(CO_2)/(p(N_2)+p(CO_2))=0.1$, $p(N_2)/(p(N_2)+p(CO_2))=0.9$ and $p(CO_2)/(p(N_2)+p(CO_2))=0.9$, $p(N_2)/(p(N_2)+p(CO_2))=0.1$.

The second component group B comprises at least one of the components of the group consisting of:

1,1,1,3,4,4,4-heptafluoro-3-(tri-fluoro-methyl)butan-2-one with a partial pressure between 0.1 bar and 0.7 bar at a temperature of 20° C., 1,1,1,2,4,4,5,5,5-nonafluoro-4-(tri-fluoromethyl)pentan-3-one with a partial pressure between 0.01 bar and 0.3 bar at a temperature of 20° C., sulfur hexafluoride with a partial pressure between 0.1 bar and 2 bar at a temperature of 20° C., and one or more hydrofluoroethers with a partial pressure between 0.2 bar and 1 bar at a temperature of 20° C.

Thus, an improved insulation performance can be achieved for the insulation fluid of the electrical apparatus.

In other embodiments, the first component group A comprises:

the components nitrogen and oxygen with relative partial pressures between $p(N_2)/(p(O_2)+p(N_2))=0.75$, $p(O_2)/(p(O_2)+p(N_2))=0.25$ and $p(N_2)/(p(O_2)+p(N_2))=0.90$, $p(O_2)/(p(O_2)+p(N_2))=0.10$.

The second component group B comprises the component 1,1,1,3,4,4,4-heptafluoro-3-(tri-fluoromethyl) butan-2-one with a partial pressure between 0.25 bar and 0.5 bar and/or the component 1,1,1,2,4,4,5,5,5-nona-fluoro-4-(tri-fluoromethyl)pentan-3-one with a partial pressure between 0.02 bar and 0.3 bar at a temperature of 20° C.

Thus, an improved insulation performance can be achieved for the insulation fluid of the electrical apparatus.

In other embodiments of the method, the dielectric breakdown strength $E_{bd}$ of the insulation fluid is derivable using a plurality of the component concentrations $c_X$, $c_Y$, and $c_Z$ of the components X, Y, and Z of the insulation fluid. $E_{bd}$ can be derived according to $$E_{bd} = S(c_X, c_Y, c_Z, \ldots) \sum_{i=X,Y,Z,\ldots} c_i E_{crit,i}$$

with $c_X$, $c_Y$, and $c_Z$ being the component concentrations of the components X, Y, and Z; with $E_{crit,X}$, $E_{crit,Y}$, and $E_{crit,Z}$ being component-specific critical field strengths of the components X, Y, and Z (i.e. the critical field strengths of the single components); with $S(c_X, c_Y, c_Z)$ being a component specific synergy parameter which, e.g., can also be electrode-geometry and electrode-surface-roughness dependent; and with i being an index for the components X, Y, and Z.

The synergy parameter $S(c_X, c_Y, c_Z)$ is a component and component-concentration dependent parameter that describes the amount of enhancement or reduction of the dielectric breakdown strength $E_{bd}$ of the insulation fluid over a concentration weighted average dielectric breakdown strength as expected from a linear combination of the concentration weighted critical field strengths $E_{crit,X}$, $E_{crit,Y}$, and $E_{crit,Z}$ of the single components X, Y, and Z. This enhancement or reduction is due to complementary properties and/or interactions of the molecules of the single components X, Y, and Z in slowing down and/or attaching free electrons present in the insulation fluid mixture. One or more possible combinations of the components X, Y, and Z can have—at least for certain combinations of the component concentrations $c_X$, $c_Y$, and $c_Z$—a synergy parameter $S(c_X, c_Y, c_Z)>1$. For example, all components in the first component group A can show nonlinear enhancement (i.e. $S(c_X, c_Y, c_Z)>1$, in particular $>1.20$) of the dielectric breakdown strength $E_{bd}$ of the insulation fluid with at least one component in the second component group B at least for certain combinations of the component concentrations $c_X$, $c_Y$, and $c_Z$.

Then, the components X, Y, and Z and/or their respective component concentrations $c_X$, $c_Y$, and $c_Z$ are selected such that the synergy parameter $S(c_X, c_Y, c_Z)$ is greater than 1 (for at least one combination of the component concentrations $c_X$, $c_Y$, and $c_Z$). This has the advantage that improved dielectric breakdown strength $E_{bd}$ of the insulation fluid is achieved while a derivation of $E_{bd}$ is simplified.

In other embodiments of the method, the first component group A comprises the components X and Y and the second component group B at least comprises the component Z. Then, a component-group-specific critical field strength $E_{crit,A}$ for the first component group A and/or a component-group-specific critical field strength $E_{crit,B}$ for the second component group B can be derived according to $$E_{crit,A} = S_A(c_X, c_Y) \sum_{i=X,Y} c_i E_{crit,i}$$

and/or $$E_{crit,B} = S_B(c_Z, \ldots) \sum_{i=Z,\ldots} c_i E_{crit,i}$$

with $c_X$, $c_Y$, and $c_Z$ being the component concentrations of the components X, Y, and Z; with $E_{crit,X}$, $E_{crit,Y}$, and $E_{crit,Z}$ being component-specific critical field strengths of the components X, Y, and Z; with $S_A(c_X, c_Y)$ and $S_B(c_Z, \ldots)$ being intra-component group synergy parameters of the component groups A and B; and with i being an index for the components X and Y for component group A and for at least (hence the dots) the component Z for component group B. Again, the intra-component group synergy parameters $S_A(c_X, c_Y)$ and $S_B(c_Z, \ldots)$ are partial-pressure-dependent parameters that describe the amount of enhancement or reduction of the component-group-specific critical field strength $E_{crit,A}$ and/or $E_{crit,B}$ of the component groups A and B over average critical field strengths as expected from the critical field strengths $E_{crit,X}$, $E_{crit,Y}$, and $E_{crit,Z}$ of the single components X, Y, and Z in the respective component groups A and/or B.

This has the advantage that component-group-specific critical field strength $E_{crit,A}$ and/or $E_{crit,B}$ of the component groups A and B are easier to derive.

In other embodiments, the intra-component group synergy parameters $S_A(c_X, c_Y)$ and $S_B(c_Z, \ldots)$ are (e.g. within ±10%) equal to 1 for one or more or all combinations of the component concentrations $c_X$ and $c_Y$ and/or $c_Z$. In other words, the component-group-specific critical field strength $E_{crit,A}$ and/or $E_{crit,B}$ within the component groups A and B are not (considerably) enhanced over the component-specific critical field strengths $E_{crit,X}$, $E_{crit,Y}$, and $E_{crit,Z}$. This is achieved by selecting the components X, Y, and Z and/or their respective component concentrations $c_X$, $c_Y$, and $c_Z$ accordingly.

Thus, the operating parameter P of the electrical apparatus becomes easier to derive, because component group specific parameters like $E_{crit,A}$ and/or $E_{crit,B}$ can be used.

In other embodiments, the method further comprises the method element of deriving a dielectric breakdown strength $E_{bd}$ of the insulation fluid according to $$E_{bd} = S(c_A, c_B) \sum_{i=A,B} c_i E_{crit,i}$$

with $E_{crit,A}$ and $E_{crit,B}$ being component-group-specific critical field strengths of the component groups A and B (as, e.g., derived above or from a prestored table in a computer memory); with $c_A$ and $c_B$ being the group concentrations of the component groups A and B; with $S(c_A, c_B)$ being an inter-component group synergy parameter; and with i being an index for the component groups A and B. The inter-component group synergy parameter $S(c_A, c_B)$ describes the amount of enhancement or reduction of the dielectric breakdown strength $E_{bd}$ of the insulation fluid over a group concentration weighted average of the component-group-specific critical field strengths $E_{crit,A}$ and $E_{crit,B}$.

This has the advantage that the operating parameter P of the electrical apparatus that depends on the dielectric breakdown strength $E_{bd}$ becomes easier to derive because component group specific parameters like $c_A$, $c_B$, $E_{crit,A}$ and $E_{crit,B}$ can be used.

In other embodiments, the inter-component group synergy parameter $S(c_A, c_B)$ is greater than 1, in particular >1.20, for at least one combination of the group concentrations $c_A$ and $c_B$ of the first and second component groups A and B. This is achieved by selecting the components X, Y, and Z and/or their respective component concentrations $c_X$, $c_Y$, and $c_Z$ accordingly. This has the advantage that an improved dielectric breakdown strength $E_{bd}$ of the insulation fluid is achieved due to the nonlinear enhancement of the dielectric breakdown strength $E_{bd}$.

In other embodiments, the method further comprises the method element of deriving the group concentrations $c_A$ and $c_B$ of the component groups A and B (and additionally or alternatively the component concentrations $c_X$, $c_Y$, and $c_Z$ of the components X, Y, and Z) using the above mentioned measurement variables. This is done by using at least one relating equation, e.g. an equation of state (i.e. a "thermodynamic equation describing the state of matter under a given set of physical conditions", from http://en.wikipedia.org/wiki/Equation_of_state as accessed on Nov. 16, 2011). The same or a different relating equation can be used for each of the component groups A and B (and/or for each of the components X, Y, and Z). Thus, a suitable relating equation can be used for each component group and/or component.

In other embodiments, the relating equation/equations is or are selected from the group consisting of:
the ideal gas law, i.e. pV=nRT with p being an absolute pressure, V being a volume, n being a number of molecules (usually expressed in moles), R being the ideal gas constant, and T being an absolute temperature,
the van-der-Waals equation of state, i.e. $(p+a/V_m^2)(V_m-b)=RT$ with $V_m$ being a molar volume and a, b being substance-specific parameters for the respective component (in particular, a and b can also be derived as effective parameters for a specific insulation fluid mixture),
the virial equation of state, i.e. $pV_m/(RT)=1+B(T)/V_m+C(T)/V_m^2+D(T)/V_m^3+\ldots$ with $B(T)$, $C(T)$, $D(T)$, ... being temperature-dependent terms that correspond to interactions between molecules,
the Beattie-Bridgeman equation of state, i.e. $p=R_uT/(v^2)(1-c/(vT^3))(v+B)-A/(v^2)$ with $A=A_0(1-a/v)$, $B=B_0(1-b/v)$, $R_u$ being a gas constant in the form $R_u=8.314$ kPa m$^3$/(kmol K), v being a molar volume, and a, b, c, $A_0$, and $B_0$ being substance-specific parameters for the respective component (in particular, again a and b can also be derived as effective parameters for a specific insulation fluid mixture), and
the Peng-Robinson equation of state, i.e. $p=RT/(V_m-b)-a(T)/(V_m(V_m+b)+b(V_m-b))$ with a(T) and b being empirical parameters.

When a relating equation other than the ideal gas law is used, the behavior of a gas can be better predicted than with the ideal gas law alone and the prediction can be extended to liquids. This is possible by putting in terms to describe attractions and repulsions between molecules.

In other embodiments, at least three measurement variables are measured by means of at least one sensor. One or more relating equation (s) is or are used to derive the group concentrations $c_A$ and $c_B$ of the component groups A and B using the measurement variables. The relating equation (s) is or are functions of at least one weighted average value of a component-specific parameter, in particular of a molecular mass, for the first and second component groups A and B. This has the advantage that the number of unknowns is reduced which, e.g., enables the derivation of the operating parameter P from a smaller number of measurement variables.

Exemplary measurement variables are at least indicative of a pressure (p) and a temperature (T) of the insulation fluid. Thus, a determination of the at least one quantity which is indicative of the group concentrations $c_A$ and $c_B$ of the first and second component groups A and B is simplified.

In embodiments, the measurement variables are at least indicative of the pressure (p), the temperature (T), and a density (ρ) of the insulation fluid. Thus, a determination of the at least one quantity which is indicative of the group concentrations $c_A$ and $c_B$ of the first and second component groups A and B is simplified.

Other exemplary measurement variables are additionally indicative of at least one element of the group consisting of a thermal conductivity (λ), a viscosity (η), and a speed of sound ($c_S$) of or in the insulation fluid. Thus, a determination of the at least one quantity which is indicative of the group concentrations $c_A$ and $c_B$ of the first and second component groups A and B is simplified.

In other embodiments of the method, a ratio (e.g. $c_X/c_Y$) of the component concentrations (e.g. $c_X$ and $c_Y$) of the components (e.g. X and Y) in each component group (e.g. component group A in this example) is constant (or varies less than ±10%, preferably less than ±1%) over a period of the application of the method, e.g. 400 days or 4000 days or 10000 days. Advantageously, the method is applied repeatedly, e.g. once or twice a day, over this period. Preferably, the method is intended to be used continuously, e.g. to produce one measurement point every second, such as to derive good averaging statistics and permit an early trend detection.

In other words, preferential leakage of one of the components in a single component group A or B does not (or not to a considerable degree) occur. Or, in other words, the relative composition of all component groups A, B, . . . remains constant or varies less than the above mentioned value. Thus, a more or less constant composition of the component groups can be assumed which simplifies the derivation of the operating parameter P of the electrical apparatus.

In embodiments, the operating parameter P of the fluid-insulated electrical apparatus is a value of the dielectric breakdown strength $E_{bd}$ of the insulation fluid itself, an $E_{bd}$-dependent state of an indicator element (e.g. a display element showing the current value of $E_{bd}$), a change over time of the dielectric breakdown strength $E_{bd}$ (e.g. a trend or a time derivative of the value of $E_{bd}$), or a Boolean variable with its variable value being dependent on the dielectric breakdown strength $E_{bd}$ (e.g. for being fed into an LED element indicating "operational" or "failure" depending on the value of $E_{bd}$). Thus, a plurality of $E_{bd}$-depending operating parameters P can be derived.

In other embodiments, the insulation fluid comprises at least four components X, Y, Z, and ZZ with component concentrations $c_X$, $c_Y$, $c_Z$, and $c_{ZZ}$. The method comprises the method element of assigning the four or more components to three or more (hence the "dots") component groups A, B, and C with group concentrations $c_A$, $c_B$, and $c_C$. At least one of the component groups comprises two or more of the components. The method comprises the further step of determining at least one quantity of the insulation fluid which is indicative of all group concentrations, i.e. one or more quantity/quantities from which all group concentrations can be derived. The method comprises the further method element of deriving the dielectric breakdown strength $E_{bd}$ of the insulation fluid according to $$E_{bd} = S(c_A, c_B, c_C, \ldots) \sum_{i=A,B,C,\ldots} c_i E_{crit,i}$$

with $E_{crit,i}$ for i=A, B, C, . . . being component-group-specific critical field strengths of the component groups; with $c_i$ for i=A, B, C, . . . being the group concentrations of the component groups; with $S(c_A, c_B, c_C, \ldots)$ being an inter-component group synergy parameter; and with i being an index for the component groups A, B, C, . . . .

As another aspect of the invention, a method for operating a fluid-insulated electrical apparatus such as gas-insulated medium or high voltage switchgear is disclosed using a method as described above. As it is apparent from the description herein, the term "method for operating a fluid-insulated electrical apparatus" relates to a method for making the electrical apparatus available and/or maintaining the operation (i.e. keeping the electrical apparatus in an operative condition) of the electrical apparatus. This is achieved by deriving the at least one $E_{bd}$-dependent operating parameter P using the at least one quantity which is indicative of the group concentration $c_A$ of the first component group A and of the group concentration $c_B$ of the second component group B. Thus, the safe operation of the electrical apparatus can be maintained.

In other embodiments of the operating method, the method further comprises a method element of actively or passively circulating the insulation fluid for homogenizing a density and/or a mixture of the first and/or the second and/or the third components X, Y, and/or Z. This is, e.g., achieved by means of a fan or by convection. This step is preferably carried out before the step of determining the at least one quantity of the insulation fluid. Thus, a more meaningful determination of the quantity is enabled.

In other embodiments, the method further comprises at least one method element of the group consisting of:

Increasing at least one of the component concentrations $c_X$, $c_Y$, and/or $c_Z$ of the components X, Y, and/or Z of the insulation fluid. This can, e.g., be achieved by means of injecting an amount of at least one of the components X, Y, and/or Z from a component reservoir into a compartment of the electrical apparatus. Thus, the respective component(s) component of the insulation fluid in the compartment can be replenished on demand which minimizes downtime of the electrical apparatus in case of a malfunction;

Reducing at least one of the component concentrations $c_X$, $c_Y$, and/or $c_Z$ of the components X, Y, and/or Z of the insulation fluid. Thus, an excess amount of the respective component(s) of the insulation fluid can be removed from the compartment of the electrical apparatus;

Reducing a concentration of at least one contaminant (i.e. an unwanted substance in the insulation fluid) in the insulation fluid, in particular by means of a filter adsorbing the contaminant. Thus, unwanted substances which can lower the insulation performance can be removed from the insulation fluid;

At least partially evaporating a condensed amount of at least one of the components X, Y, and/or Z of the insulation fluid. This can, e.g., be achieved by means of a heater located in the lower part of the compartment. Thus, unwanted insulation-fluid-component-condensation which can occur, e.g., at low ambient temperatures, can be effectively counteracted.

Condensing an amount of at least one of the components X, Y, and/or Z of the insulation fluid, in particular by means of a cooler. Thus, the gaseous amount of the condensed component can be reduced.

As a consequence of carrying out one or more of the above method elements or steps, a suitable mixing ratio for the insulation fluid can be more easily maintained. This or these step(s) are preferably selected in dependence of or using the operating parameter P in which the electrical apparatus is in.

As another aspect of the invention, a fluid-insulated electrical apparatus such as gas-insulated medium or high voltage switchgear is disclosed. The fluid-insulated electrical apparatus comprises an insulation fluid which comprises at least three components X, Y, and Z. Furthermore, the electrical apparatus comprises a control and analysis unit which is adapted to carry out the method elements (i.e. steps in any suitable time order) of a method as described above. Thus, the safe operation of the electrical apparatus can be maintained. The control and analysis unit can advantageously comprise a memory which is adapted to store a plurality of predefined values (e.g. a lookup table), such as component-specific critical field strengths $E_{crit,X}$, $E_{crit,Y}$, and $E_{crit,Z}$, and/or component-group-specific critical field strengths $E_{crit,A}$ and $E_{crit,B}$ and/or component-specific synergy parameters $S(c_X, c_Y, c_Z)$ and/or intra-component group synergy parameters $S_A(c_X, c_Y)$ and $S_B(c_Z, \ldots)$ and/or inter-component group synergy parameters $S(c_A, c_B)$ for different combinations of components X, Y, and Z and/or component concentrations $c_X$, $c_Y$, $c_Z$ and/or group concentrations $c_A$, $c_B$. In embodiments, the control and analysis unit can be adapted to issue a signal (e.g. to issue a warning signal to an operator and/or a computer readable signal) and/or to shutdown the electrical apparatus, when the electrical apparatus enters and/or leaves a predefined operating state as described by the operating parameter P. As an example, the electrical apparatus can be shut down and an alert signal can be issued when the dielectric breakdown strength $E_{bd}$ of the insulation fluid decreases below a threshold.

As another aspect of the invention, a computer program element comprising computer program code means for, when executed by a processing unit, implementing a method as described above is disclosed. This enables the integration of a method as described above into an electrical apparatus comprising a control and analysis unit.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

DETAILED DESCRIPTION OF THE INVENTION

Figure 1:
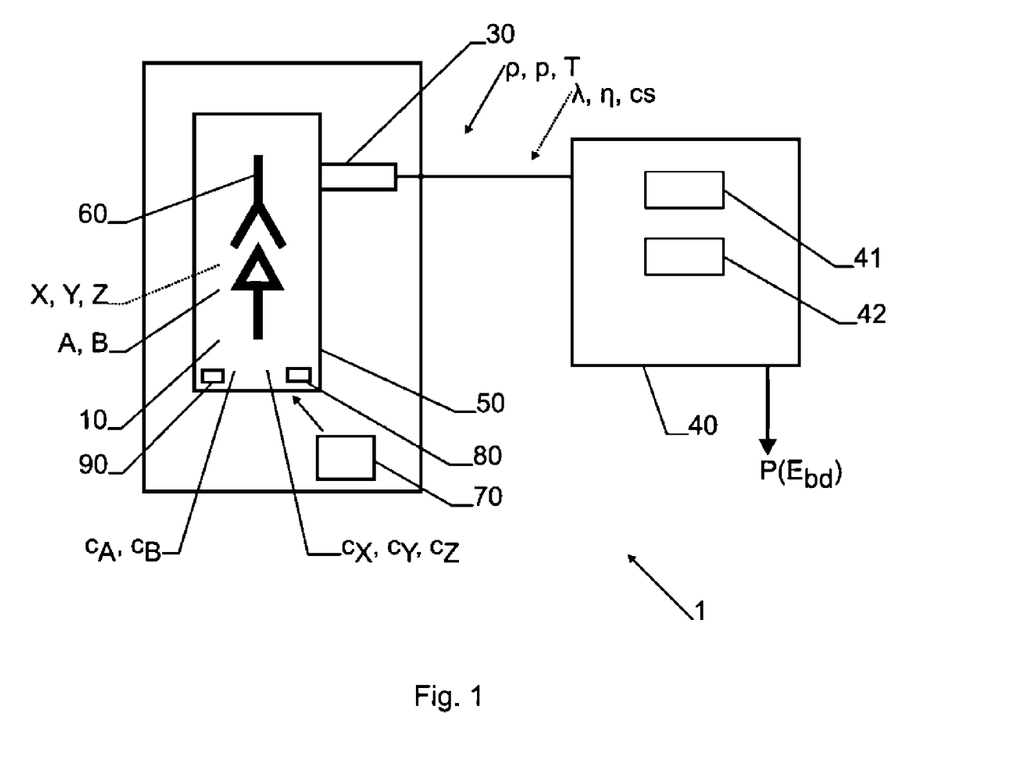
FIG. 1 shows a schematic of a fluid-insulated electrical apparatus.

FIG. 1 shows a schematic of a fluid-insulated electrical apparatus 1, i.e. here a gas insulated switch 1. An electrically active part 60 of the fluid-insulated apparatus 1 is arranged in a gas-tight compartment 50 which encloses an insulation fluid 10 for preventing the passage of electrical current from the electrically active part 60 to the compartment 50. The insulation fluid 10 is an insulation gas 10 comprising the component X which is nitrogen $N_2$ with a partial pressure $p_X=p(N_2)=5.29$ bar, the component Y which is oxygen $O_2$ with a partial pressure $p_Y=p(O_2)=1.41$ bar and the component Z which is "perfluoroketone C5" (see definition below) with a partial pressure $p_Z=p(C5)=0.3$ bar at a temperature of 20° C. The total filling pressure $p=p_X+p_Y+p_Z$ at filling time is $p=p_X+p_Y+p_Z=7$ bar, the total volume of the gas-tight compartment 50 (filling volume of the insulation gas 10) is $V=2$ m³. As an option, additionally or as replacement for component Z, a component "perfluoroketone C6" with a partial pressure $p(C6)=0.1$ bar and/or a component "perfluoroketone C7" can be added to the insulation gas 10 (not shown in FIG. 1). The components X and Y are assigned to the component group A and the component Z is assigned to the component group B (see FIG. 2 below). Thus, a weighted average value $M_A$ of the molecular masses of the two components X and Y in the first component group A differs from a weighted average value $M_B$ of the molecular mass of the component in the second component group B: Here, $M_A=28.8$ g/mol and $M_B=266$ g/mol. The measurement variables pressure p, temperature T, and density ρ (e.g. WO 2010/043268 A1 discloses a suitable density sensor device for this purpose) of the insulation fluid 10 mixture are measured by the sensors 30 and electrical signals indicative of these measurement variables are transmitted to the analysis and control unit 40 comprising a processing unit 41 and a memory 42.

As an option, additionally or as a replacement for the density ρ of the insulation gas 10, other suitable measurement variables like thermal conductivity λ, viscosity η, and/or speed of sound $c_S$ of or in the insulation gas 10 can be measured by the same or a different sensor device 30 (not shown in FIG. 1). The measurement variables can then be related to the concentration values $c_A$, $c_B$ of the component groups A and B of the insulation fluid 10, e.g. by using the following relating equation (if pressure p, temperature T, and speed of sound $c_S$ are measured):

$$c_S = \sqrt{\frac{RT(c_A c_{pA} + c_B c_{pB})}{(c_A M_A + c_B M_B)(c_A c_{VA} + c_B c_{VB})}}$$

with $c_A$ and $c_B$ being the desired group concentration values in mole fractions of the component groups A and B with $c_A+c_B=1$, $c_A=p_A/p$, and $c_B=p_B/p$, $p_A$ and $p_B$ being partial pressures of the component groups A and B, R being the ideal gas constant, $M_A$ and $M_B$ being (averaged) molecular masses of the component groups A and B, and $c_{pA}$, $c_{pB}$, $c_{VA}$, and $c_{VB}$ being known specific heat values of the component groups A and B at constant pressures and constant volumes, respectively.

If pressure p, temperature T, and viscosity η are measured, the following relating equation can, e.g., be used:

$$\eta(T) = \frac{c_A \eta_A(T)}{c_A \Phi_{AA} + c_B \Phi_{AB}} + \frac{c_B \eta_B(T)}{c_B \Phi_{BB} + c_A \Phi_{BA}}$$

with $$\Phi_{ij}(T) = \frac{1}{2\sqrt{2}} \left(1 + \frac{M_i}{M_j}\right)^{-1/2} \left[1 + \left(\frac{\eta_i(T)}{\eta_j(T)}\right)^{1/2} \left(\frac{M_j}{M_i}\right)^{1/4}\right]^2$$

and with i=A, B, with j=A, B, with $c_A$ and $c_B$ being the desired group concentration values in mole fractions of the component groups A and B with $c_A+c_B=1$, $c_A=p_A/p$, and $c_B=p_B/p$, $p_A$ and $p_B$ being partial pressures of the component groups A and B, $\eta_A(T)$ and $\eta_B(T)$ being known temperature dependent viscosities of the component groups A and B, and $M_A$ and $M_B$ being (averaged) molecular masses of the component groups A and B.

If pressure p, temperature T, and thermal conductivity λ are measured, the following relating equation can, e.g., be used:

$$\lambda(T) = \frac{c_A \lambda_A(T)}{c_A \Phi_{AA} + c_B \Phi_{AB}} + \frac{c_B \lambda_B(T)}{c_B \Phi_{BB} + c_A \Phi_{BA}}$$

-continued with $$\Phi_{ij}(T) = \frac{1}{2\sqrt{2}}\left(1 + \frac{M_i}{M_j}\right)^{-1/2}\left[1 + \left(\frac{\eta_i(T)}{\eta_j(T)}\right)^{1/2}\left(\frac{M_j}{M_i}\right)^{1/4}\right]^2$$

and with i=A, B, with j=A,B, with $c_A$ and $c_B$ being the desired concentration values in mole fractions of the component groups A and B with $c_A+c_B=1$, $c_A=p_A/p$, and $c_B=p_B/p$, $p_A$ and $p_B$ being partial pressures of the component groups A and B, $\lambda_A(T)$ and $\lambda_B(T)$ being known temperature dependent thermal conductivities of the component groups A and B, $\eta_A(T)$ and $\eta_B(T)$ being known temperature dependent viscosities of the component groups A and B, and $M_A$ and $M_B$ being (averaged) molecular masses of the component groups A and B.

E.g. U.S. Pat. No. 6,305,212 B1, U.S. Pat. No. 6,272,905 B1, and T. Lofquist et. al: "SPEED OF SOUND MEASUREMENTS IN GAS-MIXTURES AT VARYING COMPOSITION USING AN ULTRASONIC GAS FLOW METER WITH SILICON BASED TRANSDUCERS" (e.g. http://pure.ltu.se/portal/files/60931/artikel.pdf as accessed on 18 Nov. 2011) give further examples on how to relate different measurement variables.

In this embodiment, this is not necessary, however, because measurement variables indicative of the pressure p, the temperature T, and the density ρ are measured as discussed above. The analysis and control unit 40 determines the partial pressure $p_A$ of the first component group A and the partial pressure $p_B$ of the second component group B using the following equations:

$$p_{tot} = p_A + p_B \quad \text{Eq. 1}$$

$$\rho_{tot} = \frac{M_A p_A}{RT} + \frac{M_B p_B}{RT} \quad \text{Eq. 2}$$

$$p_A = \frac{\frac{RT}{M_A}\rho_{tot} - \frac{M_B}{M_A}p_{tot}}{\left(1 - \frac{M_B}{M_A}\right)} \quad \text{Eq. 3}$$

$$p_B = \frac{p_{tot} - \frac{RT}{M_A}\rho_{tot}}{\left(1 - \frac{M_B}{M_A}\right)} \quad \text{Eq. 4}$$

with $p_{tot}$ being the (total) pressure p, $p_{tot}$ being the (total) density ρ, T being the temperature, R being the ideal gas constant, and $M_A$ and $M_B$ being the weighted average values of the molecular masses of the component groups A and B, respectively. Here, the ideal gas law pV=nRT and the equations n=m/M and m=ρV with m being a mass and V being a volume are used for both component groups A and B as an approximation. As an alternative, different relating equations could be used for both component groups A and B as discussed above.

Then, the operating parameter P of the electrical apparatus 1 (which is the dielectric breakdown strength $E_{bd}$ of the insulation fluid 10 in this embodiment) is derived from the group partial pressures $p_A$ and $p_B$ (which are—as it is obvious to a person skilled in the art—directly linked to the group concentrations $c_A$ and $c_B$ via $c_i=p_i/p$, i=A, B), from component-group-specific critical field strengths $E_{crit,A}$ and $E_{crit,B}$, and from the inter-component group synergy parameter $S(c_A, c_B)$ according to the following equation:

$$E_{bd} = S(c_A, c_B)\sum_{i=A,B} c_i E_{crit,i}$$

The component-group-specific critical field strengths $E_{crit,A}$ and $E_{crit,B}$ and the inter-component group synergy parameter $S(c_A, c_B)$ can be prestored in the memory 42 of the analysis and control unit 40. The inter-component group synergy parameter $S(c_A, c_B)$ can be prestored as a lookup-table for a plurality of $c_A$-$c_B$-combinations, interpolation can additionally be used between prestored values. The intra-component group synergy parameters are equal to 1. Thus,—albeit the insulation fluid 10 comprises three components X, Y, and Z—the dielectric breakdown strength $E_{bd}$ of the insulation fluid 10 can more easily be derived from only three measurement variables pressure p, temperature T, and density ρ. This is possible due to the grouping step as described above.

Whenever the dielectric breakdown strength $E_{bd}$ of the insulation fluid 10 decreases below a threshold, (i.e. the electrical apparatus 1 leaves an "operational" operating state as defined by the parameter P), an alert signal can be issued to a user from the control unit 40 and an emergency shutdown of the electrical switch 1 can be initiated.

Furthermore, optionally, depending on the entered operating state, countermeasures can be taken automatically by the electrical apparatus 1: As an example, if the ambient temperature drops severely and component Z partly condenses in the lower part of the compartment 50, heater 80 can be engaged to evaporate at least a part of the condensed component Z, thus ensuring a sufficient gaseous amount of component Z in the gaseous phase of the insulation fluid 10 in the compartment 50.

As another example, if preferential leakage of components A and B occurs, e.g., due to a very small leak in the compartment 50, an amount of these components can be replenished from a pressurized component reservoir 70, thus minimizing downtime of the electrical apparatus 1.

As yet another example, a filter 90 in the compartment 50 can be used to remove an unwanted substance (i.e. a contaminant of the insulation fluid 10, e.g. due to arcing) from the insulation fluid 10.

Figure 2:
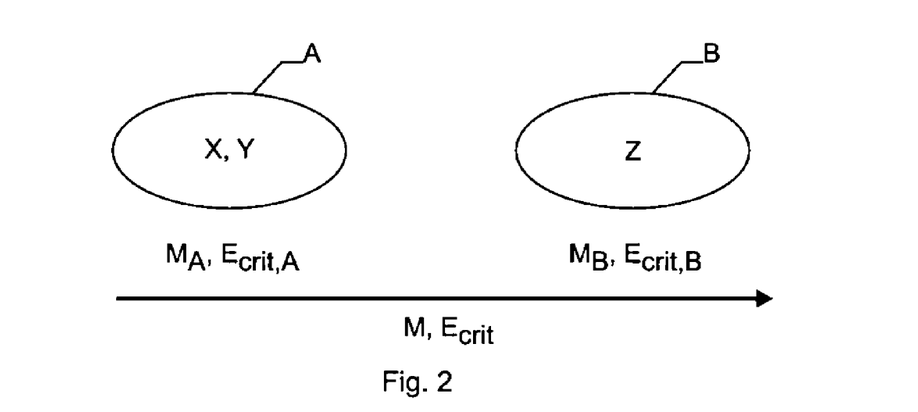
FIG. 2 shows a schematic of an assignment of three components X, Y, and Z to two component groups A and B.

FIG. 2 shows a schematic of an assignment of the three components X, Y, and Z of FIG. 1 to the two component groups A and B. The components are assigned to the component groups A and B based on their molecular masses of $M_X$=32 g/mol, $M_Y$=28 g/mol, and $M_Z$=266 g/mol, as described above. Thus, weighted average value of the molecular mass of $M_A$=28.8 g/mol and $M_B$=266 g/mol result. As a result, an absolute value $|M_A-M_B|$ of the difference between the weighted average values $M_A$-$M_B$ is larger than standard deviations of the distributions of the components' values which are $\sigma_{M,A}$=2.33 g/mol and $\sigma_{M,B}$=0 g/mol (unweighted standard deviations). Thus, the components X, Y, and Z are assigned to the first and second component groups A and B based on similar molecular masses. A similar approach could be used for grouping by similar component specific critical field strengths $E_{crit,X}$, $E_{crit,Y}$ and $E_{crit,Z}$.

Grouping the components based on similar molecular masses has two reasons: (1) The closer the molecular masses of grouped components are, the less will undesired leakage rates between these components differ. Therefore, an approximation, that the relative concentrations of these grouped components (i.e. in each component group) remains constant, is better. (2) Some substance-specific and/or empirical parameters of relating equations will be more similar for grouped components of similar molecular masses.

As an effect of the grouping approach, the dielectric breakdown strength $E_{bd}$ of the insulation fluid 10 can more easily be derived from only three measurement variables pressure p, temperature T, and density ρ because group-specific parameters can be used.

Figure 3:
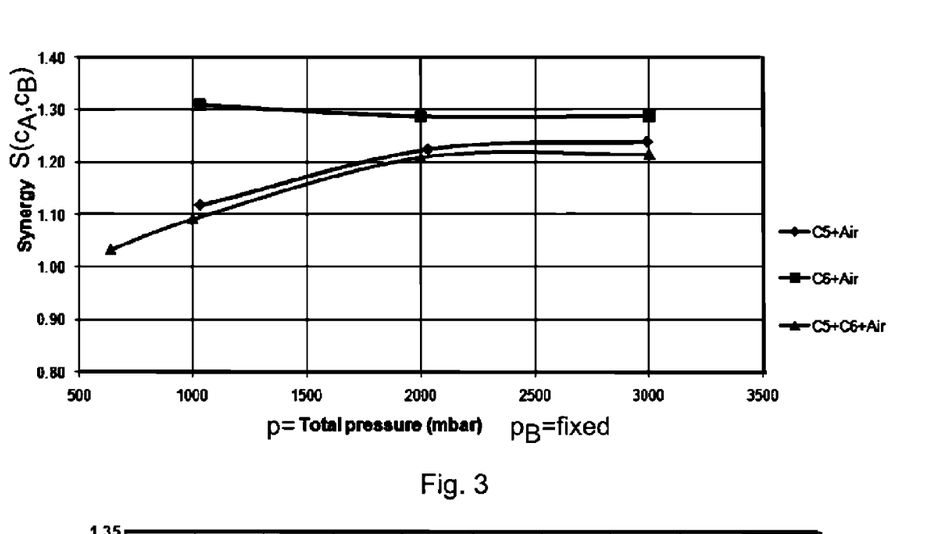
FIG. 3 shows an inter-component group synergy parameter $S(c_A, c_B)$ as a function of the total pressure p with fixed partial pressures $p_B$ for different component groups B.

FIG. 3 shows the inter-component group synergy parameter $S(c_A, c_B)$ as a function of total pressure $p=p_A+p_B$ with fixed partial pressures $p_B$ for different component groups B. The same relation for relating partial pressures to concentrations as discussed above is used. Specifically, the rectangles refer to a component group B comprising the perfluoroketone C6 with a partial pressure $p_B=0.1$ bar, the diamonds refer to a component group B comprising the perfluoroketone C5 with a partial pressure $p_B=0.3$ bar, and the triangles refer to a component group B comprising the perfluoroketones C5 and C6 with partial pressures $p_{B,C5}=0.3$ bar and $p_{B,C6}=0.1$ bar, i.e., $p_B=0.4$ bar. The component group A of the insulation fluid 10 consists of synthetic air (80% $N_2$ and 20% $O_2$). The total pressure $p=p_A+p_B$ (x-axis) is varied by adding more and more synthetic air and the inter-component group synergy parameter $S(c_A, c_B)$ (y-axis) is shown for different total pressures p (and hence different partial pressures $p_A$ or concentrations $c_A$, respectively). As it can be seen from the figure, for the C5 (diamonds) and for the mixed C5-C6 (triangles) component groups B, the inter-component group synergy parameter $S(c_A, c_B)$ and hence the dielectric breakdown strength $E_{bd}$ of the insulation fluid 10 increase up to a total pressure of about 2 bar whereas for the C6 (rectangles) component group B, the inter-component group synergy parameter $S(c_A, c_B)$ remains almost constant with increasing total pressure p. Thus, if the partial pressure $p_A$ is increased to a total pressure of about 2 bar for C5 and C5-C6, the dielectric breakdown strength $E_{bd}$ of the insulation fluid is more and more nonlinearly enhanced.

Figure 4:
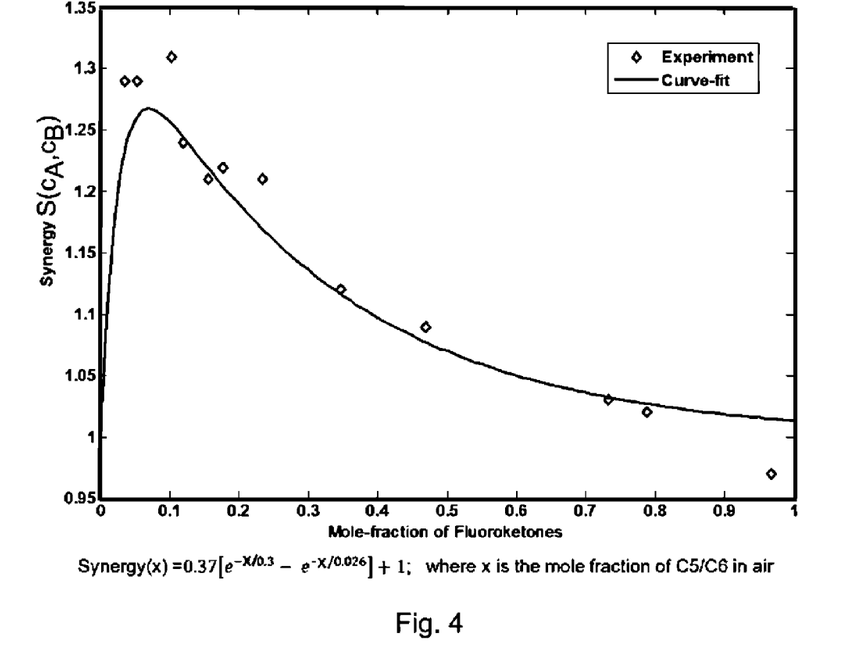
FIG. 4 shows an inter-component group synergy parameter $S(c_A, c_B)$ as a function of a mole-fraction of the perfluoroketones C5 or C6 (group B) in air (group A).

Similar to FIG. 3, FIG. 4 shows an inter-component group synergy parameter $S(c_A, c_B)$ as a function of the mole fraction $c_B/(c_A+c_B)$ of the perfluoroketone C5 or the perfluoroketone C6 which is (one at a time, no mixture in component group B in this embodiment) comprised in component group B. The component group A of the insulation fluid 10 consists of synthetic air (80% $N_2$ and 20% $O_2$). The mole fraction (x-axis) defines a ratio of number of particles. E.g., a mole fraction of component group B of 0.5 means that half of the molecules in the compartment 50 of the electrical apparatus 1 belong to component group B. The diamonds show experimental values for $S(c_A, c_B)$ whereas the line refers to a fit function for the experimental synergy datapoints of the form $S(c_A, c_B)=a*\exp(-x/x1)-\exp(-x/x2)]+b$ with $a=0.37$, $x1=0.3$, $x2=0.026$, and $b=1$ being fit parameters and x being the mole fraction $x=c_B/(c_A+c_B)$ of the perfluoroketones C5 or C6 (experimental datapoints for both components are shown) which are—one at a time—comprised in component group B. As it can be seen from the figure, the inter-component group synergy parameter $S(c_A, c_B)$ and hence the achievable dielectric breakdown strength $E_{bd}$ of the insulation fluid 10 increases up to a mole fraction of component group B of about 0.1 and then decreases. Thus, if the mole fraction (or, equivalently, the concentration $c_B$) of component group B is increased to about 0.1 the dielectric breakdown strength $E_{bd}$ of the insulation fluid is maximally nonlinearly enhanced.

Definitions

The term "aliphatic" relates to both "linear aliphatic" and "branched aliphatic".

The term "fluid" relates to "a substance, such as a liquid [and/] or gas, that can flow, has no fixed shape, and offers little resistance to an external stress" (from http://www.thefreedictionary.com/fluid, accessed on Sep. 11, 2011).

The term "weighted average value" of a property N of the components in a component group relates to a statistical average (such as the median or the mean) of the property N of all the components in the component group. This statistical average is weighted by the concentrations of the components that form the respective component group. If the term "weighted average value" of a property N of a single component that forms a component group is used, the property N of the single component itself is referred to. Similar definitions apply for the statistical spread. In particular, a statistical spread of a property N in a component group consisting of only a single component is 0.

The term "high-voltage" relates to voltages larger than 50 kV.

The term "medium-voltage" relates to voltages larger than 1 kV.

The term "concentration" herein shall define
a quantity (with units) which is indicative of an amount per volume unit, e.g. a particle number per volume unit, moles per volume unit, or a number density, or
a number (without units) which is indicative of a ratio such as a mole fraction, a pressure-normalized partial pressure, a volume fraction, a mass fraction, or a density fraction.

The compound class "hydrofluoroethers" relates to specific partially or fully fluorinated ethers as, e.g., available from 3M.

The compound "C5" particularly relates to a partially or fully fluorinated fluoroketone selected from the group consisting of the compounds defined by the following structural formulae in which at least one hydrogen atom, preferably all hydrogen atoms, is/are substituted with a fluorine atom/fluorine atoms:

(Ia)

(Ib)

, and (Ic)

(Id)

The compound "C6" particularly relates to a partially or fully fluorinated fluoroketone selected from the group consisting of the compounds defined by the following structural formulae in which at least one hydrogen atom, preferably all hydrogen atoms, is/are substituted with a fluorine atom/fluorine atoms:

(IIa), (IIb), (IIc), (IId), (IIe), (IIf), and (IIg)

The compound "C7" particularly relates to a partially or fully fluorinated fluoroketone selected from the group consisting of the compounds defined by the following structural formulae in which at least one hydrogen atom, preferably all hydrogen atoms, is/are substituted with a fluorine atom/fluorine atoms:

(IIIa), (IIIb), (IIIc), (IIId), (IIIe), (IIIf), (IIIg), (IIIh), (IIIi), (IIIj), (IIIk), (IIIl), (IIIm), and (IIIn)

Note:
While there are shown and described presently preferred embodiments of the invention, it is to be distinctly understood that the invention is not limited thereto but may otherwise variously be embodied and practiced within the scope of the following claims. Therefore, terms like "preferred", "advantageous" or the like denote optional features or embodiments only. Method step generally means method element, i.e. does not imply that the steps shall be executed in the order as they are listed.

REFERENCE NUMBERS

1: electrical apparatus
10: insulation fluid

A, B: component groups of the insulation fluid 10
X, Y, Z: components of the insulation fluid 10
ρ, p, T, λ, η, $c_S$: measurement variables
30: sensors
40: control and analysis unit
41: processing unit
42: memory
50: gas-tight compartment
60: electrically active part
$c_X$, $c_Y$, $c_Z$: component concentrations, e.g. expressed in mol/m$^3$ or without units, of components X, Y, Z
$c_A$, $c_B$: group concentrations of component groups A, B
$E_{crit,X}$, $E_{crit,Y}$, $E_{crit,Z}$: component-specific critical field strengths, e.g. expressed in kV/(cm*(mol/m3))
$E_{crit,A}$, $E_{crit,B}$: component-group-specific critical field strengths, e.g. expressed in kV/(cm*(mol/m$^3$))
$S(c_X, c_Y, c_Z)$: synergy parameter
$S_A(c_X, c_Y)$, $S_B(c_Z, \ldots)$: intra-component group synergy parameters
$S(c_A, c_B)$: inter-component group synergy parameter
Ebd: dielectric breakdown strength of the insulation fluid 10 of the electrical apparatus 1, e.g. expressed in kV/cm.
70: component reservoir
80: heater
90: filter

What is claimed is:

1. A method for deriving at least one operating parameter P of a fluid-insulated electrical apparatus, which is a gas-insulated medium or high voltage switchgear or a transformer and which comprises an insulation fluid with at least three components X, Y, and Z with component concentrations $c_X$, $c_Y$, and $c_Z$, and
which derived operating parameter P is dependent on a dielectric breakdown strength $E_{bd}$ of the insulation fluid of the electrical apparatus and defines an operational operating state or a failure state of the electrical apparatus,
the method comprising the method elements of:
measuring by means of at least one sensor a plurality of measurement variables, wherein the measurement variables are indicative of at least a pressure and a temperature of the insulation fluid,
assigning the at least three components X, Y, and Z to at least a first component group A with a group concentration $c_A$ and to at least a second component group B with a group concentration $c_B$, wherein at least the first component group A comprises at least two of the components X, Y, and Z or wherein at least the second component group B comprises at least two of the components X, Y, and Z,
wherein the at least three components X, Y, and Z are assigned to the at least two component groups A and B in such a way that a weighted average value $M_A$ of a molecular mass of the component or components in the first component group A differs from a weighted average value $M_B$ of a molecular mass of the component or components in the second component group B,
deriving the group concentrations $c_A$ and $c_B$ of the component groups A and B by using the measurement variables and at least one relating equation, which is the same or different for each of the component groups A and B, and
deriving the operating parameter P using the group concentration $c_A$ and the group concentration $c_B$;
the method further comprising at least one additional method element selected from the group consisting of:
increasing at least one of the component concentrations $c_X$, $c_Y$ and/or $c_Z$ of the components X, Y, and/or Z of the insulation fluid by injecting an amount of at least one of the components X, Y, and/or Z from a component reservoir into a compartment of the electrical apparatus,
reducing at least one of the component concentrations $c_X$, $c_Y$, and/or $c_Z$ of the components X, Y, and/or Z of the insulation fluid,
reducing a concentration of at least one contaminant in the insulation fluid by means of a filter,
at least partially evaporating a condensed amount of at least one of the components X, Y, and/or Z of the insulation fluid by means of a heater, and
condensing an amount of at least one of the components X, Y, and/or Z of the insulation fluid by means of a cooler.

2. The method of claim 1, wherein an absolute value $|M_A-M_B|$ of the difference between the weighted average values $M_A-M_B$ of the molecular masses of the components X, Y, and Z between the first and second component groups A and B is larger than weighted statistical spreads $\sigma_{M,A}$ and $\sigma_{M,B}$ of the molecular masses of the components X, Y, and Z within the first and second component groups A and B.

3. The method of claim 2, wherein the absolute value $|M_A-M_B|$ of the difference between the weighted average values $M_A-M_B$ of the molecular masses of the components X, Y, and Z between the first and second component groups A and B is larger than 20 g/mol.

4. The method of any of the claims 2 to 3, wherein the second component group B comprises at least one of the components from the group consisting of:
sulfur hexafluoride,
partially or fully fluorinated ethers, in particular hydrofluoroethers, hydrofluoro monoethers, hydrofluoro monoethers containing at least 3 carbon atoms, perfluoro monoethers, or perfluoro monoethers containing at least 4 carbon atoms,
partially or fully fluorinated ketones, in particular hydrofluoro monoketones, perfluoro monoketones, perfluoro monoketones comprising at least 5 carbon atoms, or perfluoro monoketones comprising exactly 5 or 6 or 7 or 8 carbon atoms, and
mixtures thereof, and
wherein the first component group A comprises at least one of the components from the group consisting of:
nitrogen,
oxygen,
carbon dioxide,
nitric oxide,
nitrogen dioxide,
nitrous oxide,
argon,
methanes, in particular partially or fully halogenated methanes, in particular tetrafluoromethane or trifluoroiodomethane,
air, in particular technical air or synthetic air, and
mixtures thereof.

5. The method of claim 2, wherein the absolute value $|M_A-M_B|$ of the difference between the weighted average values $M_A-M_B$ of the molecular masses of the components X, Y, and Z between the first and second component groups A and B is larger than 50 g/mol.

6. The method of claim 2, wherein the absolute value $|M_A-M_B|$ of the difference between the weighted average values $M_A$–$M_B$ of the molecular masses of the components X, Y, and Z between the first and second component groups A and B is larger than 100 g/mol.

7. The method of claim 1, wherein the at least three components X, Y, and Z are assigned to the at least two component groups A and B in such a way that a weighted average value $E_{crit,A}$ of a critical field strength of the component or components in the first component group A differs from a weighted average value $E_{crit,B}$ of a critical field strength of the component or components in the second component group B.

8. The method of claim 7, wherein an absolute value $|E_{crit,A} - E_{crit,B}|$ of the difference between the weighted average values $E_{crit,A}$–$E_{crit,B}$ of the critical field strengths of the components X, Y, and Z between the first and second component groups A and B is larger than weighted statistical spreads $\sigma_{E crit,A}$ and $\sigma_{E crit,B}$ of the critical field strengths of the components X, Y, and Z within the first and second component groups A and B.

9. The method of claim 1, wherein the second component group B comprises at least one of the components from the group consisting of:
  sulfur hexafluoride,
  partially or fully fluorinated ethers, in particular hydrofluoroethers, hydrofluoro monoethers, hydrofluoro monoethers containing at least 3 carbon atoms, perfluoro monoethers, or perfluoro monoethers containing at least 4 carbon atoms,
  partially or fully fluorinated ketones, in particular hydrofluoro monoketones, perfluoro monoketones, perfluoro monoketones comprising at least 5 carbon atoms, or perfluoro monoketones comprising exactly 5 or 6 or 7 or 8 carbon atoms, and
  mixtures thereof, and
wherein the first component group A comprises at least one of the components from the group consisting of:
  nitrogen,
  oxygen,
  carbon dioxide,
  nitric oxide,
  nitrogen dioxide,
  nitrous oxide,
  argon,
  methanes, in particular partially or fully halogenated methanes, in particular tetrafluoromethane or trifluoroiodomethane,
  air, in particular technical air or synthetic air, and
  mixtures thereof.

10. The method of claim 9, wherein the second component group B comprises at least one component from the group consisting of:
  cyclic and/or aliphatic fluoropentanones,
  cyclic and/or aliphatic fluorohexanones,
  cyclic and/or aliphatic fluoroheptanones,
  sulfur hexafluoride, and
  hydrofluoroethers.

11. A computer program element comprising computer program code means for, when executed by a processing unit, implementing a method according to any one of the claims 1, 6 and 10.

12. The method of claim 9, wherein the first component group A comprises:
  the components nitrogen and oxygen with relative partial pressures between $p(N_2)/(p(O_2)+p(N_2))=0.7$, $p(O_2)/(p(O_2)+p(N_2))=0.3$ and $p(N_2)/(p(O_2)+p(N_2))=0.95$, $p(O_2)/(p(O_2)+p(N_2))=0.05$, or
  the components carbon dioxide and oxygen with relative partial pressures between $p(CO_2)/(p(O_2)+p(CO_2))=0.6$, $p(O_2)/(p(O_2)+p(CO_2))=0.4$ and $p(CO_2)/(p(O_2)+p(CO_2))=0.99$, $p(O_2)/(p(O_2)+p(CO_2))=0.01$, or
  the components carbon dioxide and nitrogen with relative partial pressures between $p(CO_2)/(p(N_2)+p(CO_2))=0.1$, $p(N_2)/(p(N_2)+p(CO_2))=0.9$ and $p(CO_2)/(p(N_2)+p(CO_2))=0.9$, $p(N_2)/(p(N_2)+p(CO_2))=0.1$, and
wherein the second component group B comprises at least one components of the group consisting of:
  1,1,1,3,4,4,4-heptafluoro-3-(tri-fluoro-methyl)butan-2-one with a partial pressure between 0.1 bar and 0.7 bar at a temperature of 20° C.,
  1,1,1,2,4,4,5,5,5-nonafluoro-4-(tri-fluoromethyl)pentan-3-one with a partial pressure between 0.01 bar and 0.3 bar at a temperature of 20° C.,
  sulfur hexafluoride with a partial pressure between 0.1 bar and 2 bar at a temperature of 20° C., and
  one or more hydrofluoroethers with a partial pressure between 0.2 bar and 1 bar at a temperature of 20° C.

13. The method of any one of the claims 8, 9, and 12, wherein the dielectric breakdown strength $E_{bd}$ of the insulation fluid is derivable using a plurality of the component concentrations $c_X$, $c_Y$, and $c_Z$ of the components X, Y, and Z according to $$E_{bd} = S(c_X, c_Y, c_Z, \ldots) \sum_{i=X,Y,Z,\ldots} c_i E_{crit,i}$$

with $c_X$, $c_Y$, and $c_Z$ being the component concentrations of the components X, Y, and Z; with $E_{crit,X}$, $E_{crit,Y}$, and $E_{crit,Z}$ being component-specific critical field strengths of the components X, Y, and Z; with $S(c_X, c_Y, c_Z)$ being a component-specific synergy parameter; and with i being an index for the components X, Y, and Z,
wherein the components X, Y, and Z and/or the component concentrations $c_X$, $c_Y$, and $c_Z$ are selected such that the synergy parameter $S(c_X, c_Y, c_Z)$ is greater than 1 for at least one combination of the component concentrations $c_X$, $c_Y$, and $c_Z$.

14. The method of any one of the claims 8, 9, and 12, wherein the first component group A comprises the components X and Y and the second component group B comprises at least the component Z, and
wherein a component-group-specific critical field strength $E_{crit,A}$ for the first component group A and/or a component-group-specific critical field strength $E_{crit,B}$ for the second component group B is or are derivable according to $$E_{crit,A} = S_A(c_X, c_Y) \sum_{i=X,Y} c_i E_{crit,i}$$

and/or $$E_{crit,B} = S_B(c_Z, \ldots) \sum_{i=Z,\ldots} c_i E_{crit,i}$$

with $c_X$, $c_Y$, and $c_Z$ being the component concentrations of the components X, Y, and Z; with $E_{crit,X}$, $E_{crit,Y}$, and $E_{crit,Z}$ being component-specific critical field strengths of the components X, Y, and Z; with $S_A(c_X, c_Y)$ and $S_B(c_Z, \ldots)$ being intra-component group synergy parameters of the component groups A and B; and with i being an index for the components X and Y for component group A and for at least the component Z for component group B.

15. The method of any of the claims 8, 9, and 12, further comprising the method element of deriving the dielectric breakdown strength $E_{bd}$ of the insulation fluid according to $$E_{bd} = S(c_A, c_B) \sum_{i=A,B} c_i E_{crit,i}$$

with $E_{crit,A}$ and $E_{crit,B}$ being component-group-specific critical field strengths of the component groups A and B; with $c_A$ and $c_B$ being the group concentrations of the first and second component groups A and B; with $S(c_A, c_B)$ being an inter-component group synergy parameter; and with i being an index for the component groups A and B.

16. The method of claim 9, wherein the first component group A comprises:
the components nitrogen and oxygen with relative partial pressures between $p(N_2)/(p(O_2)+p(N_2))=0.75$, $p(O_2)/(p(O_2)+p(N_2))=0.25$ and $p(N_2)/(p(O_2)+p(N_2))=0.90$, $p(O_2)/(p(O_2)+p(N_2))=0.10$, and
wherein the second component group B comprises the component 1,1,1,3,4,4,4-heptafluoro-3-(tri-fluoromethyl)butan-2-one with a partial pressure between 0.25 bar and 0.5 bar and/or the component 1,1,1,2,4,4,5,5,5-nona-fluoro-4-(tri-fluoromethyl)pentan-3-one with a partial pressure between 0.02 bar and 0.3 bar at a temperature of 20° C.

17. The method of claim 9, wherein the second component group B comprises at least one component from the group consisting of:
cyclic and/or aliphatic perfluoropentanones,
cyclic and/or aliphatic perfluorohexanones,
cyclic and/or aliphatic perfluoroheptanones,
sulfur hexafluoride, and
hydrofluoroethers.

18. The method of claim 9, wherein the second component comprises 1,1,1,3,4,4,4-heptafluoro-3-(tri-fluoromethyl)butan-2-one.

19. The method of claim 9, wherein the second component comprises 1,1,1,2,4,4,5,5,5-nonafluoro-4-(tri-fluoromethyl)pentan-3-one.

20. The method of claim 1, wherein the dielectric breakdown strength $E_{bd}$ of the insulation fluid is derivable using a plurality of the component concentrations $c_X$, $c_Y$, and $c_Z$ of the components X, Y, and Z according to $$E_{bd} = S(c_X, c_Y, c_Z, ...) \sum_{i=X,Y,Z,...} c_i E_{crit,i}$$

with $c_X$, $c_Y$, and $c_Z$ being the component concentrations of the components X, Y, and Z; with $E_{crit,X}$, $E_{crit,Y}$, and $E_{crit,Z}$ being component-specific critical field strengths of the components X, Y, and Z; with $S(c_X, c_Y, c_Z)$ being a component-specific synergy parameter; and with i being an index for the components X, Y, and Z,
wherein the components X, Y, and Z and/or the component concentrations $c_X$, $c_Y$, and $c_Z$ are selected such that the synergy parameter $S(c_X, c_Y, c_Z)$ is greater than 1 for at least one combination of the component concentrations $c_X$, $c_Y$, and $c_Z$.

21. The method of claim 1, wherein the first component group A comprises the components X and Y and the second component group B comprises at least the component Z, and
wherein a component-group-specific critical field strength $E_{crit,A}$ for the first component group A and/or a component-group-specific critical field strength $E_{crit,B}$ for the second component group B is or are derivable according to $$E_{crit,A} = S_A(c_X, c_Y) \sum_{i=X,Y} c_i E_{crit,i}$$

and/or $$E_{crit,B} = S_B(c_Z, ...) \sum_{i=Z,...} c_i E_{crit,i}$$

with $c_X$, $c_Y$, and $c_Z$ being the component concentrations of the components X, Y, and Z; with $E_{crit,X}$, $E_{crit,Y}$, and $E_{crit,Z}$ being component-specific critical field strengths of the components X, Y, and Z; with $S_A(c_X, c_Y)$ and $S_B(c_Z, ...)$ being intra-component group synergy parameters of the component groups A and B; and with i being an index for the components X and Y for component group A and for at least the component Z for component group B.

22. The method of claim 21, wherein the components X, Y, and Z and/or the component concentrations $c_X$, $c_Y$, and $c_Z$ are selected such that the intra-component group synergy parameter or intra-component group synergy parameters $S_A(c_X, c_Y)$ and/or $S_B(c_Z, ...)$ is or are equal to 1.

23. The method of claim 1, further comprising the method element of deriving the dielectric breakdown strength $E_{bd}$ of the insulation fluid according to $$E_{bd} = S(c_A, c_B) \sum_{i=A,B} c_i E_{crit,i}$$

with $E_{crit,A}$ and $E_{crit,B}$ being component-group-specific critical field strengths of the component groups A and B; with $c_A$ and $c_B$ being the group concentrations of the first and second component groups A and B; with $S(c_A, c_B)$ being an inter-component group synergy parameter; and with i being an index for the component groups A and B.

24. The method of claim 23, wherein the components X, Y, and Z and/or the component concentrations $c_X$, $c_Y$, and $c_Z$ are selected such that the inter-component group synergy parameter $S(c_A, c_B)$ is greater than 1 for at least one combination of the group concentrations $c_A$ and $c_B$ of the first and second component groups A and B.

25. The method of claim 1, further comprising the method element of deriving the component concentrations $c_X$, $c_Y$, and $c_Z$ of the components X, Y, and Z using the measurement variables by using at least one relating equation,
wherein the relating equation is the same or different for each of the components X, Y, and Z.

26. The method of claim 1 or 25, wherein the relating equation or relating equations is or are selected from the group consisting of: ideal gas law, van-der-Waals equation of state, virial equation of state, Beattie-Bridgeman equation of state, and Peng-Robinson equation of state.

27. The method of claim 1, wherein at least three measurement variables are measured by means of the at least one sensor and wherein a or the relating equation or relating equations is or are used to derive the group concentrations $c_A$ and $c_B$ of the component groups A and B by using the measurement variables, and wherein the relating equation or relating equations is or are functions of at least one weighted average value of a component-specific parameter, in particular of a molecular mass (M), for the first and second component groups A and B.

28. The method of claim 1, wherein the measurement variables are indicative of at least the pressure (p), the temperature (T) and a density ($\rho$) of the insulation fluid.

29. The method of claim 1 or 28, wherein the measurement variables are additionally indicative of at least one element of the group consisting of: a thermal conductivity ($\lambda$), a viscosity ($\eta$), and a speed of sound ($c_S$) of or in the insulation fluid.

30. The method of claim 1, wherein a ratio of the component concentrations of the components in each component group A and B is constant or varies less than ±10% over a period of application of the method.

31. The method of claim 1, wherein the operating parameter P of the fluid-insulated electrical apparatus is selected from the group consisting of:
the dielectric breakdown strength $E_{bd}$ itself,
a state of an indicator element, the state being dependent on the dielectric breakdown strength $E_{bd}$,
a change over time of the dielectric breakdown strength $E_{bd}$, and
a Boolean variable with a variable value being dependent on the dielectric breakdown strength $E_{bd}$.

32. The method of claim 1, wherein the insulation fluid comprises at least four components X, Y, Z, and ZZ with component concentrations $c_X$, $c_Y$, $c_Z$, and $c_{ZZ}$,
the method comprising the method elements of:
assigning the at least four components to at least three component groups A, B,
and C with group concentrations $c_A$, $c_B$, and $c_C$, wherein at least one of the component groups comprises at least two of the components,
determining at least one quantity of the insulation fluid which is indicative of the group concentrations,
deriving the dielectric breakdown strength $E_{bd}$ of the insulation fluid according to $$E_{bd} = S(c_A, c_B, c_C, \ldots) \sum_{i=A,B,C,\ldots} c_i E_{crit,i}$$

with $E_{crit,i}$ for i=A, B, C, . . . being component group specific critical field strengths of the component groups; with $c_i$ for i=A, B, C, . . . being the group concentrations of the component groups; with $S(c_A, c_B, c_C, \ldots)$ being an inter-component group synergy parameter; and with i being an index for the component groups A, B, C, . . . .

33. A method according to claim 1, wherein whenever the dielectric breakdown strength $E_{bd}$ of the insulation fluid decreases below a threshold, when the electrical apparatus leaves an "operational" operating state as defined by the operating parameter P, an alert signal is issued, from a control unit to a user, and/or the electrical apparatus is shut down.

34. A method for operating a fluid-insulated electrical apparatus, in particular gas-isolated medium or high voltage switchgear, using a method of claim 1.

35. The method of claim 34, further comprising a method element of circulating the insulation fluid for homogenizing a density and/or a mixture of the first and/or the second and/or the third components X, Y, and/or Z before carrying out the method element of deriving the group concentrations $c_A$ and $c_B$ of the component groups A and B.

36. A fluid-insulated electrical apparatus, which is a gas-isolated medium or high voltage switchgear or a transformer, comprising:
an insulation fluid which comprises at least three components X, Y, and Z,
at least one sensor for measuring a plurality of measurement variables, and
a control and analysis unit adapted to carry out the steps or method elements of the method of claim 1, including:
deriving at least one operating parameter P of the fluid-insulated electrical apparatus, which derived operating parameter P is dependent on a dielectric breakdown strength $E_{bd}$ of the insulation fluid of the electrical apparatus and defines an operational operating state or a failure state of the electrical apparatus,
measuring by means of the at least one sensor the plurality of the measurement variables, wherein the measurement variables are indicative of at least a pressure (p) and a temperature (T) of the insulation fluid,
assigning the at least three components X, Y, and Z to at least a first component group A with a group concentration $c_A$ and to at least a second component group B with a group concentration $c_B$, wherein at least the first component group A comprises at least two of the components X, Y, and Z or wherein at least the second component group B comprises at least two of the components X, Y, and Z,
wherein the at least three components X, Y, and Z are assigned to the at least two component groups A and B in such a way that a weighted average value $M_A$ of a molecular mass of the component or components in the first component group A differs from a weighted average value $M_B$ of a molecular mass of the component or components in the second component group B,
deriving the group concentrations $c_A$ and $c_B$ of the component groups A and B by using the measurement variables and at least one relating equation, which is the same or different for each of the component groups A and B, and
deriving the operating parameter P using the group concentration $c_A$ and the group concentration $c_B$.

37. The method of claim 1, wherein a ratio of the component concentrations of the components in each component group A and B is constant or varies less than ±1% over a period of application of the method.

38. The method of claim 1, wherein the at least one additional method element selected from the group includes the at least partially evaporating the condensed amount of the at least one of the components X, Y, and/or Z of the insulation fluid by means of the heater.

39. The method of claim 1, wherein the at least one additional method element selected from the group includes the condensing the amount of at least one of the components X, Y, and/or Z of the insulation fluid by means of the cooler.

40. A method for operating a fluid-insulated electrical apparatus, in particular gas-isolated medium or high voltage switchgear comprising an insulation fluid with at least three components X, Y, and Z with component concentrations $c_X$, $c_Y$ and $c_Z$, using a derived operating parameter P that is dependent on a dielectric breakdown strength $E_{bd}$ of the insulation fluid of the electrical apparatus and defines an operational operating state or a failure state of the electrical apparatus, the method comprising the steps of:

measuring by means of at least one sensor a plurality of measurement variables, wherein the measurement variables are indicative of at least a pressure and a temperature of the insulation fluid;

assigning the at least three components X, Y, and Z to at least a first component group A with a group concentration $c_A$ and to at least a second component group B with a group concentration $c_B$, wherein at least the first component group A comprises at least two of the components X, Y, and Z or wherein at least the second component group B comprises at least two of the components X, Y, and Z;

wherein the at least three components X, Y, and Z are assigned to the at least two component groups A and B in such a way that a weighted average value $M_A$ of a molecular mass of the component or components in the first component group A differs from a weighted average value $M_B$ of a molecular mass of the component or components in the second component group B;

deriving the group concentrations $c_A$ and $c_B$ of the component groups A and B by using the measurement variables and at least one relating equation, which is the same or different for each of the component groups A and B; and     deriving the operating parameter P using the group concentration $c_A$ and the group concentration $c_B$;

wherein the second component group B comprises at least one of the components from the group consisting of: sulfur hexafluoride; partially or fully fluorinated ethers, in particular hydrofluoroethers, hydrofluoro monoethers, hydrofluoro monoethers containing at least 3 carbon atoms, perfluoro monoethers, or perfluoro monoethers containing at least 4 carbon atoms; partially or fully fluorinated ketones, in particular hydrofluoro monoketones, perfluoro monoketones, perfluoro monoketones comprising at least 5 carbon atoms, or perfluoro monoketones comprising exactly 5 or 6 or 7 or 8 carbon atoms; and mixtures thereof; and     wherein the first component group A comprises at least one of the components from the group consisting of: nitrogen; oxygen; carbon dioxide; nitric oxide; nitrogen dioxide; nitrous oxide; argon; methanes, in particular partially or fully halogenated methanes, in particular tetrafluoromethane or trifluoroiodomethane; air, in particular technical air or synthetic air; and mixtures thereof;

the method further comprising at least one method element of the group consisting of:

increasing at least one of the component concentrations $c_X$, $c_Y$ and/or $c_Z$ of the components X, Y, and/or Z of the insulation fluid, in particular by means of injecting an amount of at least one of the components X, Y, and/or Z from a component reservoir into a compartment of the electrical apparatus,     reducing at least one of the component concentrations $c_X$, $c_Y$, and/or $c_Z$ of the components X, Y, and/or Z of the insulation fluid,     reducing a concentration of at least one contaminant in the insulation fluid by means of a filter,     at least partially evaporating a condensed amount of at least one of the components X, Y, and/or Z of the insulation fluid by means of a heater, and     condensing an amount of at least one of the components X, Y, and/or Z of the insulation fluid by means of a cooler.

\* \* \* \* \*